US007410029B2

(12) United States Patent
Tanaami

(10) Patent No.: US 7,410,029 B2
(45) Date of Patent: Aug. 12, 2008

(54) BASS REFLEX TYPE LOUDSPEAKER APPARATUS, LOUDSPEAKER BOX AND IMAGE DISPLAY APPARATUS

(75) Inventor: Hideo Tanaami, Kanagawa (JP)

(73) Assignee: Sony Corporation, Tokyo (JP)

( * ) Notice: Subject to any disclaimer, the term of this patent is extended or adjusted under 35 U.S.C. 154(b) by 70 days.

(21) Appl. No.: 11/364,192

(22) Filed: Mar. 1, 2006

(65) Prior Publication Data

US 2006/0201739 A1 Sep. 14, 2006

(30) Foreign Application Priority Data

Mar. 9, 2005 (JP) ............................ 2005-065995

(51) Int. Cl.

*H05K 5/02* (2006.01)
*H04R 1/02* (2006.01)
*H04R 9/18* (2006.01)
*H04R 1/20* (2006.01)
*H04R 5/02* (2006.01)

(52) U.S. Cl. ....................... 181/156; 381/349; 381/306; 381/333; 381/338

(58) Field of Classification Search ................. 181/156, 181/141; 381/306, 333, 337, 338, 349, 388
See application file for complete search history.

(56) References Cited

U.S. PATENT DOCUMENTS 3,044,570 A * 7/1962 Watts ......................... 381/184
3,327,808 A * 6/1967 Shaper ....................... 181/153
3,923,124 A * 12/1975 Hancock ..................... 181/156
3,993,162 A * 11/1976 Juuti .......................... 181/156
4,168,761 A * 9/1979 Pappanikolaou ............ 181/156
4,509,184 A * 4/1985 Yanagawa ................... 381/308
4,924,962 A * 5/1990 Terai et al. .................. 181/141
4,942,939 A * 7/1990 Harrison ..................... 181/156
5,197,103 A * 3/1993 Hayakawa .................. 381/349
5,335,283 A * 8/1994 Torii ........................... 381/118
5,343,535 A * 8/1994 Marshall ..................... 381/349
5,675,131 A * 10/1997 Saito et al. .................. 181/152
5,821,471 A * 10/1998 McCuller .................... 181/156
6,278,789 B1 * 8/2001 Potter .......................... 381/338
6,411,721 B1 * 6/2002 Spindler ...................... 381/349
2004/0062001 A1 * 4/2004 Chang et al. ................ 361/686
2005/0123162 A1 * 6/2005 Huffman .................... 381/337

FOREIGN PATENT DOCUMENTS

JP 62082899 A * 4/1987
JP 06292290 A * 10/1994
JP 11136786 A * 5/1999
JP 11205884 A * 7/1999
JP 11205886 A * 7/1999
JP 11234780 A * 8/1999
JP 2003061177 A * 2/2003
JP 2003324795 A * 11/2003

* cited by examiner

*Primary Examiner*—Edgardo San Martin
(74) *Attorney, Agent, or Firm*—Oblon, Spivak, McClelland, Maier & Neustadt, P.C.

(57) ABSTRACT

A bass reflex type loudspeaker apparatus is provided in which a long route of a bass reflex duct is obtained in the case where a loudspeaker box is made thin.

The bass reflex duct is provided in the loudspeaker box such that the route thereof is extended in a direction perpendicular to an anteroposterior direction of the loudspeaker apparatus and is curved.

16 Claims, 13 Drawing Sheets

BASS REFLEX TYPE LOUDSPEAKER APPARATUS, LOUDSPEAKER BOX AND IMAGE DISPLAY APPARATUS

CROSS REFERENCES TO RELATED APPLICATIONS

The present invention contains subject matter related to Japanese Patent Application JP 2005-065995 filed in the Japanese Patent Office on Mar. 9, 2005, the entire contents of which being incorporated herein by reference.

BACKGROUND OF THE INVENTION

1. Field of the Invention

The present invention relates to a bass reflex type loudspeaker apparatus and a loudspeaker box thereof, particularly to ones suitable when a loudspeaker box is made thin. Further, the present invention relates to an image display apparatus in which the bass reflex type loudspeaker apparatus is installed.

2. Description of the Related Art

As a kind of loudspeaker apparatus, a bass reflex type loudspeaker apparatus has been used widely. A bass reflex type loudspeaker apparatus has been known as the one in which a duct is provided in a loudspeaker box for emitting a sound generated from the back surface of a loudspeaker unit to the outside. Since a sound generated from the back surface of the loudspeaker unit is detoured in the duct to be emitted to the outside, the phase of a sound in a low frequency range is reversed (specifically, a low sound generated from the back surface of the loudspeaker unit is made to have the same phase as a low sound generated from the front surface of the loudspeaker unit), and the characteristic of a low sound range can be improved.

Typically, a bass reflex type loudspeaker apparatus in related art has a duct in pipe shape (cylindrical shape) whose route linearly extends as a bass reflex duct in a loudspeaker box (see Patent Literature 1 and 2, for example).

[Patent Literature 1] Japanese Published Patent Application No. 2003-61177 (paragraph 0007, FIG. 1)

[Patent Literature 2] Japanese Published Patent Application No. 2003-324795 (paragraphs 0064, 0077 to 0079, FIG. 3)

SUMMARY OF THE INVENTION

However, in the case where, for example, a bass reflex type loudspeaker apparatus is installed in an image display apparatus to watch video and to listen to audio simultaneously, if a loudspeaker box is made thin to save a space for the installation of a loudspeaker apparatus in the image display apparatus, because a pipe-shaped duct in related art has a linear route, the route may not be extended long. As a result, the phase of a sound in a low frequency range is not reversed, and so the characteristic of a low sound range may not be improved sufficiently.

The present invention addresses the above-identified, and other problems associated with conventional apparatuses and is made to obtain a long route of a bass reflex duct in the case where a loudspeaker box is made thin in a bass reflex type loudspeaker apparatus.

A bass reflex type loudspeaker apparatus according to an embodiment of the present invention includes: in a loudspeaker box a loudspeaker unit installed and a duct provided for emitting a sound generated from the back surface of the loudspeaker unit to the outside, in which a route of the duct is extended in a direction perpendicular to an anteroposterior direction of the loudspeaker apparatus and is curved.

Regarding the bass reflex type loudspeaker apparatus, the route of a bass reflex duct is extended in a loudspeaker box in a direction perpendicular to an anteroposterior direction (that is a thickness direction) of the loudspeaker apparatus and the route is curved. Thus, with the route extending in a direction perpendicular to the thickness direction (namely, vertical and lateral directions of the loudspeaker apparatus) and with the route being not only linear but also curved, the route of the duct can be made long in the case where the loudspeaker box is made thin.

Note that, in the bass reflex type loudspeaker apparatus, it is preferable as an example to curve the route of the duct within a plane perpendicular to an anteroposterior direction of the loudspeaker apparatus (namely, within planes in vertical and lateral directions of the loudspeaker apparatus).

Hence, the route can be made to go back and forth within planes in vertical and lateral directions of the loudspeaker apparatus, and so the route of the duct can be further made long.

Further, in the case where a route is curved within planes in vertical and lateral directions of a loudspeaker apparatus as described above, it is preferable as an example that the route of a duct is curved to be spiral-shaped or S-shaped. Hence, the route of the duct is extended going back and forth more than once within planes in vertical and lateral directions of the loudspeaker apparatus, and so the route of the duct can be further made long.

Next, a bass reflex type loudspeaker apparatus according to an embodiment of the present invention includes: in a loudspeaker box a first loudspeaker unit and a second loudspeaker unit installed and a first duct and a second duct provided for emitting sounds generated from the back surfaces of the first and second loudspeaker units to the outside, in which one of the first and second ducts is arranged toward the front of the loudspeaker apparatus and the other is arranged toward the rear of the loudspeaker apparatus, and each of routes of the first and second ducts is extended in a direction perpendicular to an anteroposterior direction of the loudspeaker apparatus and is curved within a plane perpendicular to the anteroposterior direction.

In the bass reflex type loudspeaker apparatus, one of the first and second bass reflex ducts of the first and second loudspeaker units is arranged toward the front of the loudspeaker apparatus and the other is arranged toward the rear of the loudspeaker apparatus. In other words, the first and second ducts are arranged with a certain distance from each other in an anteroposterior direction (thickness direction) of the loudspeaker apparatus.

Further, each of routes of the first and second ducts is extended in a direction perpendicular to an anteroposterior direction of the loudspeaker apparatus (in vertical and lateral directions of the loudspeaker apparatus), and is curved within a plane perpendicular to this anteroposterior direction (within planes in vertical and lateral directions of the loudspeaker apparatus).

Therefore, the routes of the first and second ducts can be extended in vertical and lateral directions of the loudspeaker apparatus without restricting each other, and can be made to go back and forth within planes in the vertical and lateral directions of the loudspeaker apparatus. Hence, the routes of the first and second ducts can be made long, in the case where the loudspeaker box is made thin.

Note that, in the bass reflex type loudspeaker apparatus, it is preferable as an example to divide the space inside the loudspeaker box into a first space and a second space by a partition board parallel to an anteroposterior direction of the loudspeaker apparatus and to arrange the first duct in the first space and the second duct in the second space.

Hence, without high cost and with a simplified structure the first and second ducts can be arranged with a certain distance from each other in an anteroposterior direction (thickness direction) of the loudspeaker apparatus.

Further, in the case where the space is divided by a partition board as described above, it is preferable as an example that: the partition board has a hole, which connects the first and second spaces, in a position corresponding to an end of the route of the second duct; a portion in the first space, which has been connected to the second space by means of the hole, is isolated from the route of the first duct; and on the first space side, the loudspeaker box has an opening for the first duct in a position corresponding to the position of an end of the route of the first duct and has an opening for the second duct in a position corresponding to the position of the hole of the partition board.

Hence, in the case where the loudspeaker box is made thin, sounds generated from the back surfaces of the first and second loudspeaker units can be emitted in the same direction through the first and second ducts whose routes are made long, respectively.

Next, a loudspeaker box for a bass reflex type loudspeaker apparatus according to an embodiment of the present invention, in which a loudspeaker unit can be installed, includes a duct provided for emitting a sound generated from the back surface of the installed loudspeaker unit to the outside, in which a route of the duct is extended in a direction perpendicular to an anteroposterior direction of the loudspeaker apparatus and is curved.

Regarding the loudspeaker box, the route of the bass reflex duct is extended in a direction perpendicular to an anteroposterior direction (that is, a thickness direction) of the loudspeaker apparatus and is curved. By thus extending a route in a direction perpendicular to a thickness direction (namely, in vertical and lateral directions of the loudspeaker apparatus) and by making the route not only linear but also curved, the route of the duct can be made long, in the case where the loudspeaker box is made thin.

Next, a loudspeaker box for a bass reflex type loudspeaker apparatus according to an embodiment of the present invention, in which two loudspeaker units can be installed, includes a first duct and a second duct provided for emitting sounds generated from the back surfaces of the two installed loudspeaker units to the outside; in which one of the first and second ducts is arranged toward the front of the loudspeaker apparatus and the other is arranged toward the rear of the loudspeaker apparatus, and each of routes of the first and second ducts is extended in a direction perpendicular to an anteroposterior direction of the loudspeaker apparatus and is curved within a plane perpendicular to the anteroposterior direction.

In the loudspeaker box, one of the first and second bass reflex ducts of the first and second loudspeaker units is arranged toward the front of the loudspeaker apparatus and the other is arranged toward the rear of the loudspeaker apparatus. In other words, the first and second ducts are arranged with a certain distance from each other in an anteroposterior direction (thickness direction) of the loudspeaker apparatus.

Further, each of routes of the first and second ducts is extended in a direction perpendicular to an anteroposterior direction of the loudspeaker apparatus (in vertical and lateral directions of the loudspeaker apparatus), and is curved within a plane perpendicular to the anteroposterior direction (within planes in vertical and lateral directions of the loudspeaker apparatus).

Therefore, the routes of the first and second ducts can be extended in vertical and lateral directions of the loudspeaker apparatus without restricting each other and can be made to go back and forth within planes in the vertical and lateral directions of the loudspeaker apparatus. Hence, the routes of the first and second ducts can be made long, in the case where the loudspeaker box is made thin.

Next, an image display apparatus according to an embodiment of the present invention includes a bass reflex type loudspeaker apparatus having a duct provided in a loudspeaker box for emitting a sound generated from the back surface of the loudspeaker unit to the outside, a route of which is extended in a direction perpendicular to an anteroposterior direction of the loudspeaker apparatus and is curved.

Further, an image display apparatus according to an embodiment of the present invention includes a bass reflex type loudspeaker apparatus having a first duct and a second duct provided in a loudspeaker box for emitting sounds generated from the back surfaces of a first loudspeaker unit and a second loudspeaker unit to the outside, one of which is arranged toward the front of the loudspeaker apparatus and the other of which is arranged toward the rear of the loudspeaker apparatus, and in which each of routes of the first and second ducts is extended in a direction perpendicular to an anteroposterior direction of the loudspeaker apparatus and is curved within a plane perpendicular to the anteroposterior direction.

The above image display apparatuses include a bass reflex type loudspeaker apparatus according to an embodiment of the present invention, in which a bass reflex type loudspeaker apparatus can be installed in a narrow space, and a sound generated from the back surface of a loudspeaker unit of the bass reflex type loudspeaker apparatus can be emitted to the outside from a bass reflex duct whose route has been made long.

According to the embodiments of the present invention, the effectiveness of the route of a bass reflex duct being long is obtained, in the case where a loudspeaker box is made thin in a bass reflex type loudspeaker apparatus.

BRIEF DESCRIPTION OF THE DRAWINGS

FIG. 13 is a diagram showing measurement results of the frequency characteristic of a bass reflex type loudspeaker apparatus to which the present invention is applied and the like.

DESCRIPTION OF THE PREFERRED EMBODIMENTS

Next, embodiments of the present invention are specifically explained using the drawings. It should be noted that hereinafter an example in which the present invention is applied to a bass reflex type loudspeaker apparatus installed in a direct-view image display apparatus will be explained.

Figure 1:
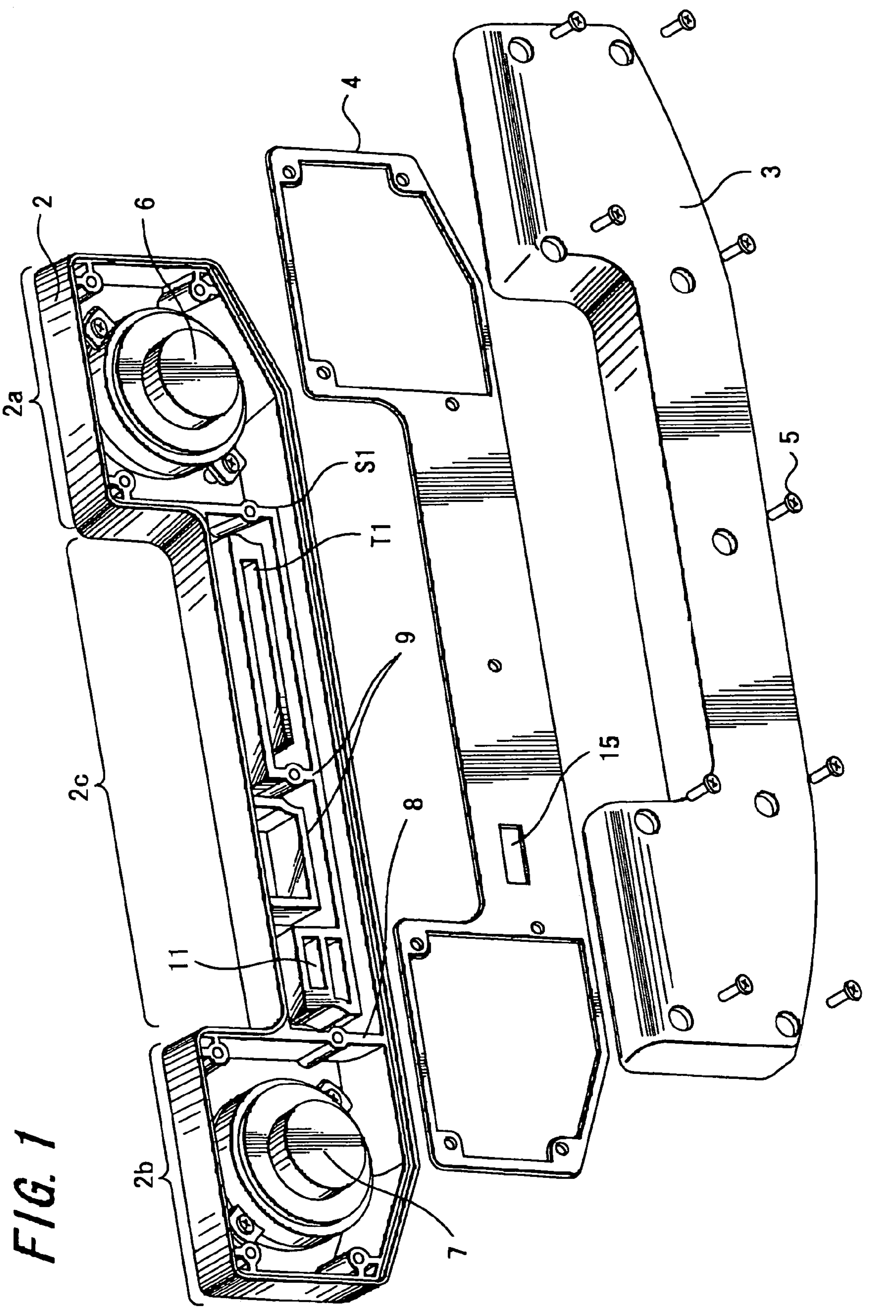
FIG. 1 is a view showing an example of the structure of a loudspeaker box to which the present invention is applied.
Figure 2:
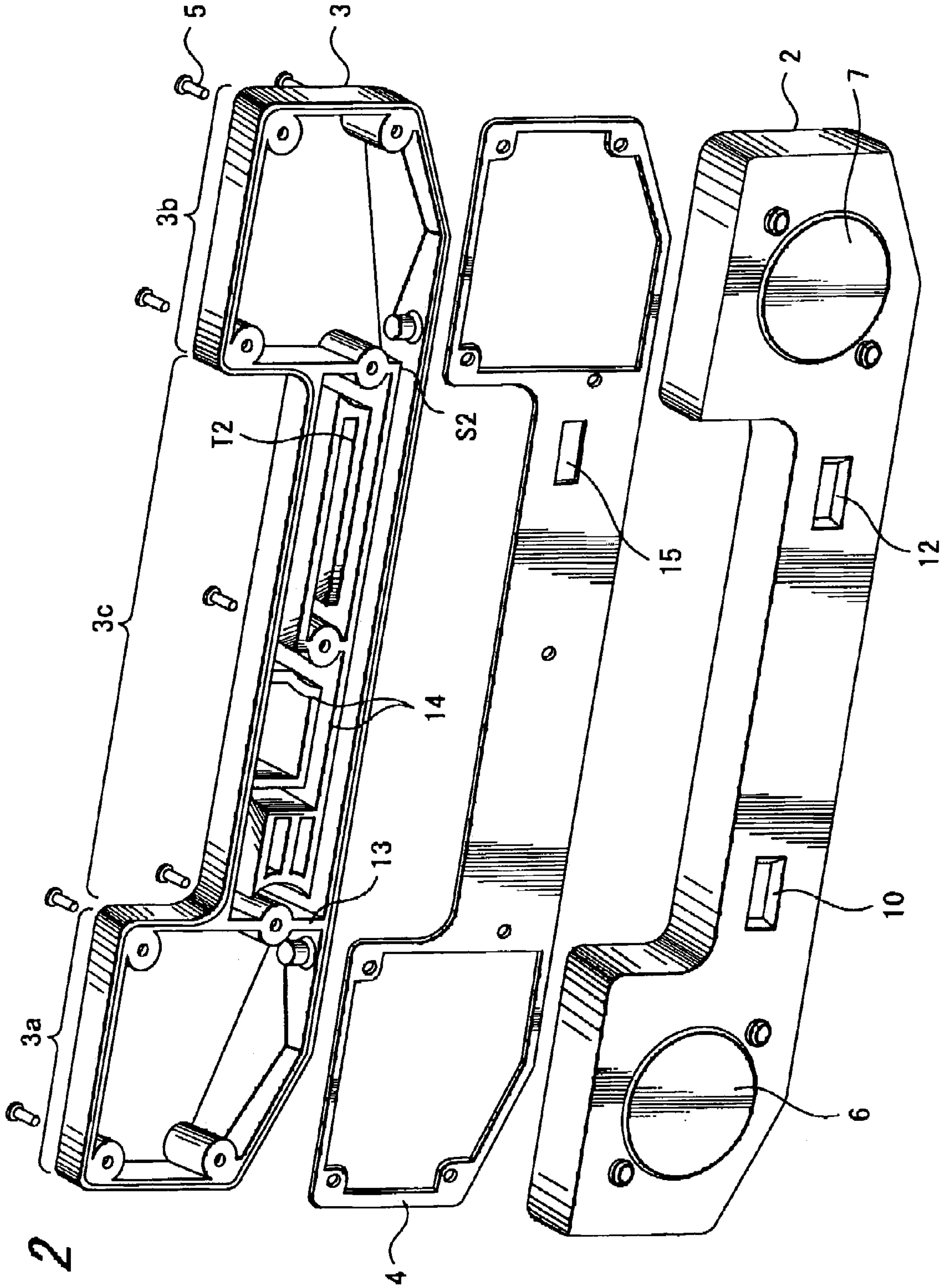
FIG. 2 is a view showing an example of the structure of a loudspeaker box to which the present invention is applied.
Figure 3:
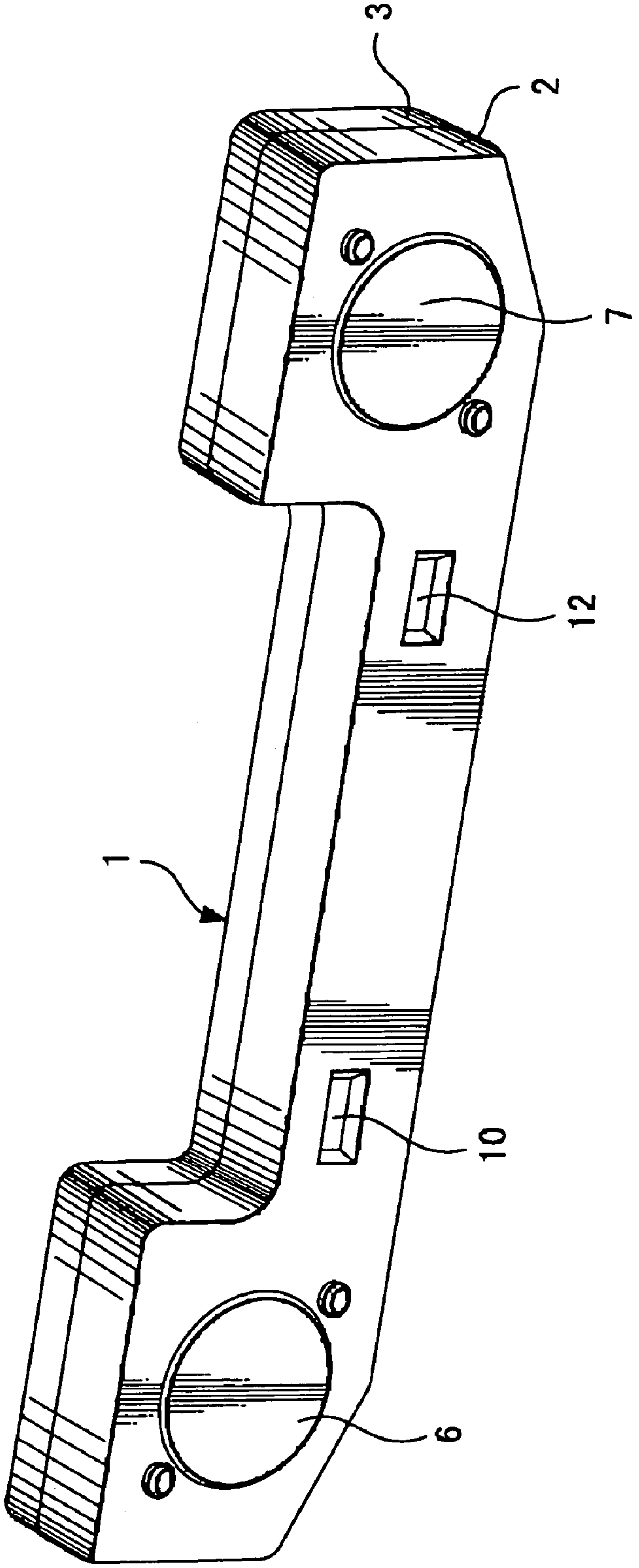
FIG. 3 is a view showing an example of the structure of a loudspeaker box to which the present invention is applied.

FIGS. 1 to 3 are views showing an example of the structure of a loudspeaker box used for a bass reflex type loudspeaker apparatus to which the present invention is applied (FIG. 1 is an exploded view seen from the back surface side, FIG. 2 is an exploded view seen from the front surface side, and FIG. 3 is a perspective view seen from the front surface side).

A loudspeaker box 1 is made of resin and includes a front surface side box 2 and a back surface side box 3. As shown in FIGS. 1 and 2, areas 2*a* and 3*a* where a loudspeaker unit 6 is installed are provided at one end of the front surface side box 2 and the back surface side box 3, respectively. Areas 2*b* and 3*b* where a loudspeaker unit 7 is installed are provided at the other end of the front surface side box 2 and the back surface side box 3, respectively. As is known, the loudspeaker units 6 and 7 each include a diaphragm to which a voice coil is attached and a magnetic circuit, and when an electrical signal is supplied to the voice coil, the magnetic circuit acts and makes the voice coil vibrate the diaphragm, so that a sound is generated.

Then, as shown in FIGS. 1 and 2, the front surface side box 2 and the back surface side box 3 are made to face each other with a rubber cushion 4 positioned in between and are fixed to each other by a plurality of screws 5, and so the loudspeaker box 1 is completed as shown in FIG. 3 (when the front surface side box 2 and the back surface side box 3 are fixed to each other with the loudspeaker units 6 and 7 installed, a bass reflex type loudspeaker apparatus is completed). As described later on, the cushion 4 has such shape that a part thereof also serves as a partition board.

The loudspeaker box 1 is mounted in an image display apparatus with the loudspeaker units 6 and 7 having been installed, and so stereo sound is listened to by means of the loudspeaker units 6 and 7 (alternatively, main audio is listened to by means of one loudspeaker unit, and sub audio is listened to by means of the other loudspeaker unit).

Figure 4:
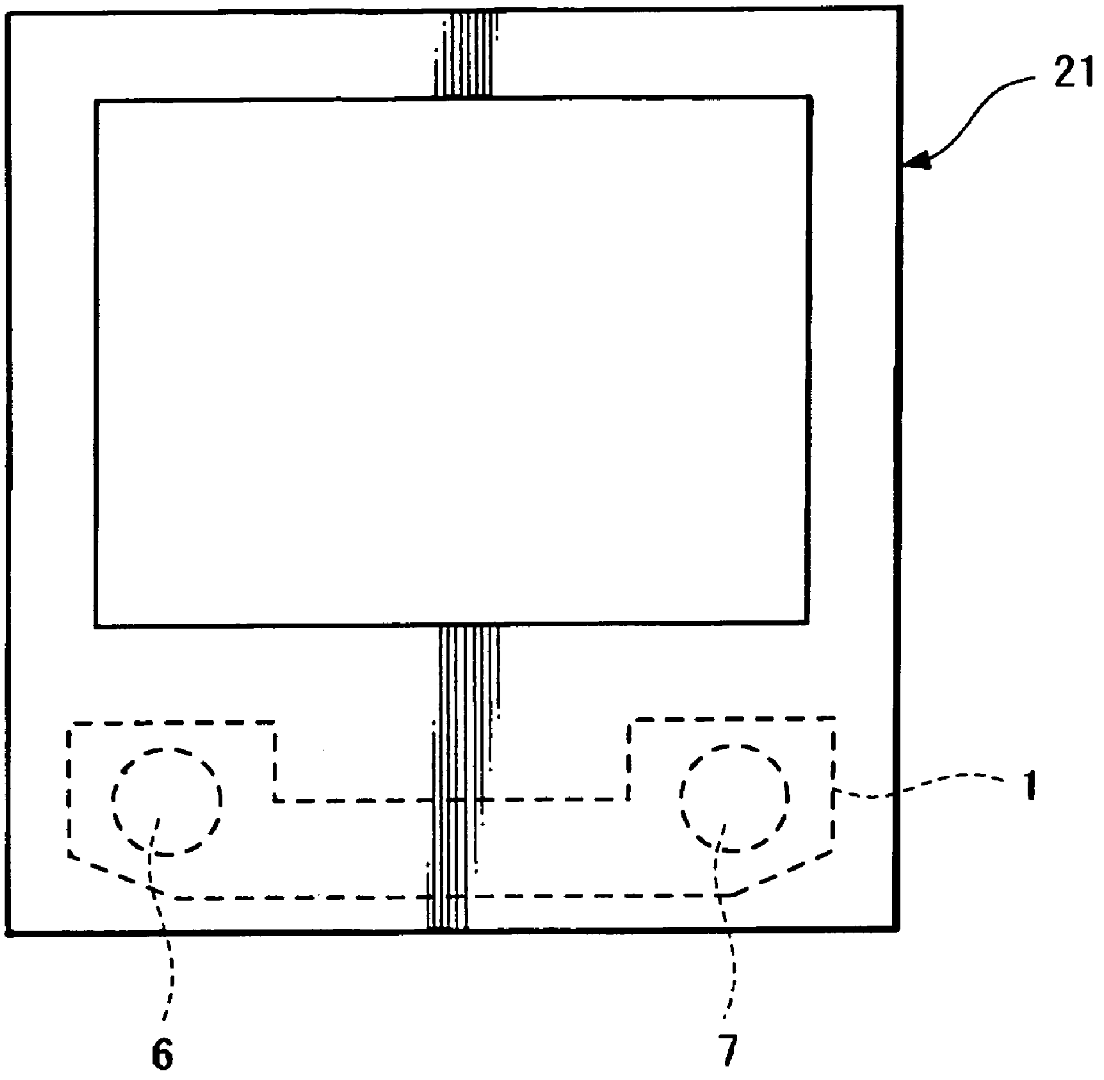
FIG. 4 is a view showing an example of the external structure of an image display apparatus in which the loudspeaker box according to FIGS. 1 to 3 is installed.

FIG. 4 shows an example of the external structure of an image display apparatus in which the loudspeaker box 1 is installed. Specifically, an image display apparatus 21 may be a television receiver, a computer display, or an apparatus in which a monitor, loudspeaker, codec and the like are integrally provided for a televised meeting.

A space for installing a bass reflex type loudspeaker apparatus is provided in a position toward the front surface inside the image display apparatus 21, and the loudspeaker box 1 to which the loudspeaker units 6 and 7 are attached is installed in this space. Although not shown in the figure, on the front surface side of the housing of the image display apparatus 21, a plurality of small holes for emitting sounds generated from the loudspeaker units 6 and 7 and from openings 10 and 12 (described later on) to the outside of the image display apparatus 21 are provided in positions corresponding to the positions where the loudspeaker units 6 and 7 are installed and to the positions of the openings 10 and 12 of the loudspeaker box 1 (however, as another structure, a gap may be provided in the bottom surface of the housing and so sounds will be emitted from the gap to the outside). In the case where the image display apparatus 21 is, for example, an apparatus for a televised meeting, images and sounds from a meeting room of another party, decoded by a codec can be watched and listened to by means of the screen and the loudspeaker units 6 and 7 of the apparatus 21.

Figure 5:
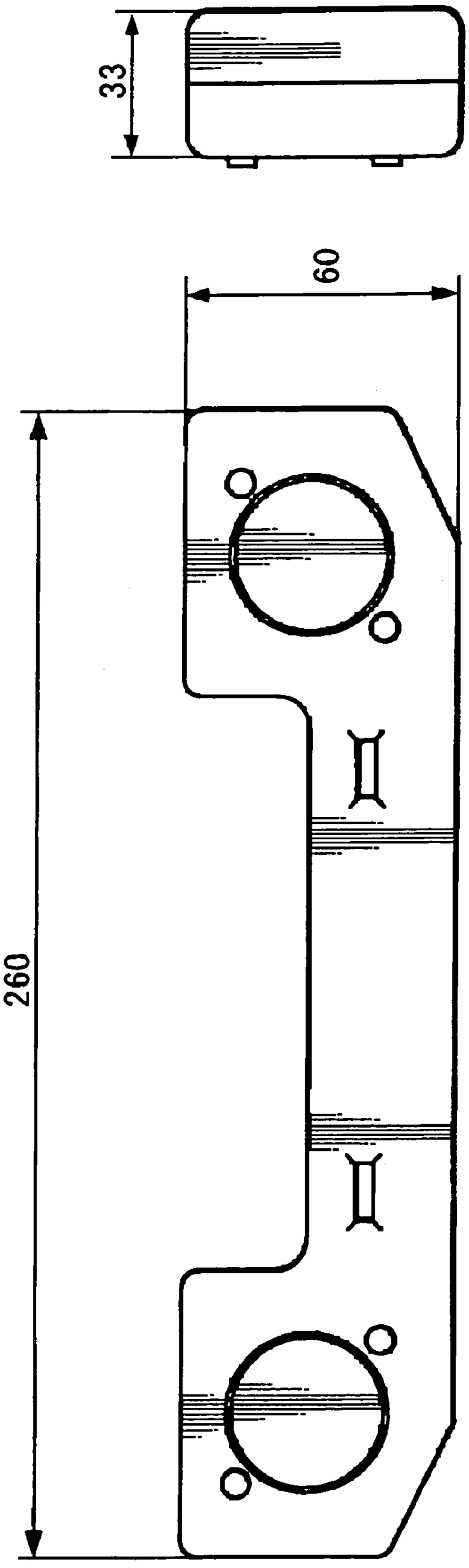
FIG. 5 is a view showing the dimensions of the loudspeaker box according to FIGS. 1 to 3.

The loudspeaker box 1 is made thin for the purpose of being installed in an image display apparatus in this manner. FIG. 5 is a view showing the dimensions of the loudspeaker box 1. The loudspeaker box 1 is 260 mm in total length (dimension in the lateral direction), 33 mm in thickness (dimension in the anteroposterior direction) and 60 mm in height (dimension in the vertical direction).

As shown in FIG. 1, in the front surface side box 2, an area 2*c* between the area 2*a* and the area 2*b* is continuous with the area 2*a* at one portion S1 but is separated from the area 2*b* by a wall 8 whose height is the same as the thickness of the front surface side box 2. Further, in the area 2*c* is formed a spiral route with a wall 9 whose height is the same as the thickness of the front surface side box 2.

Figure 6:
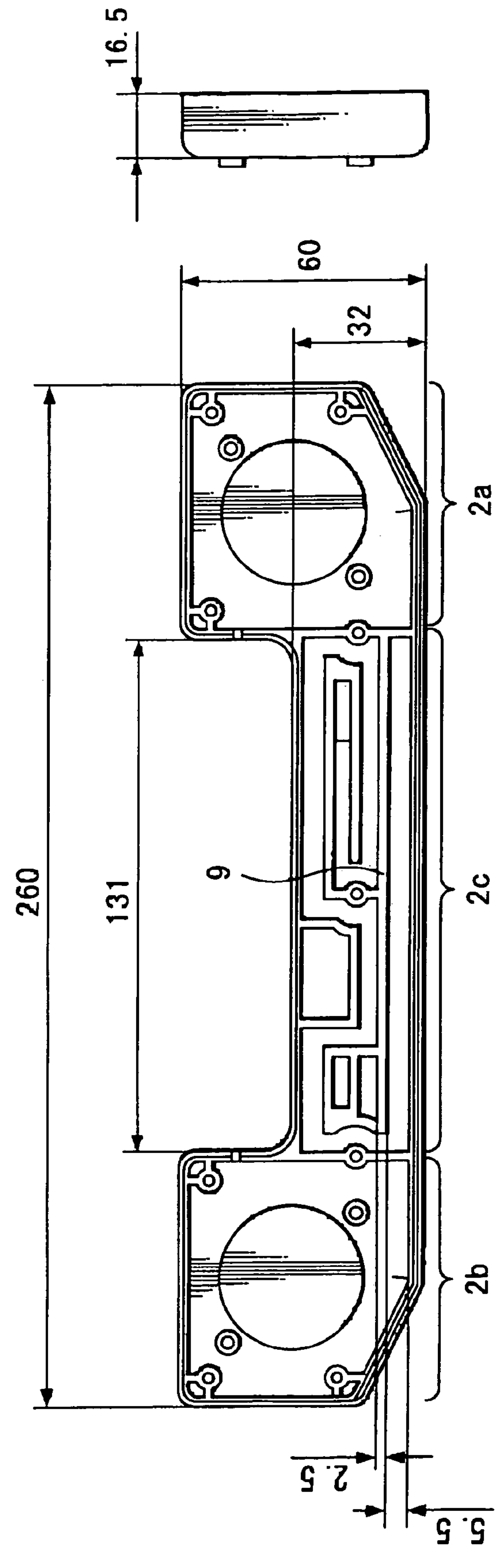
FIG. 6 is a view showing the dimensions of a front surface side box according to FIGS. 1 to 3.

FIG. 6 is a view showing the dimensions of the front surface side box 2. The front surface side box 2 is 260 mm in total length, 16.5 mm in thickness, and 60 mm in height at the portion of areas 2*a* and 2*b*. The area 2*c* is 131 mm in length and 32 mm in height. In the area 2*c*, a spiral route of 5.5 mm in width is formed by the wall 9 whose thickness is 2.5 mm.

Figure 7:
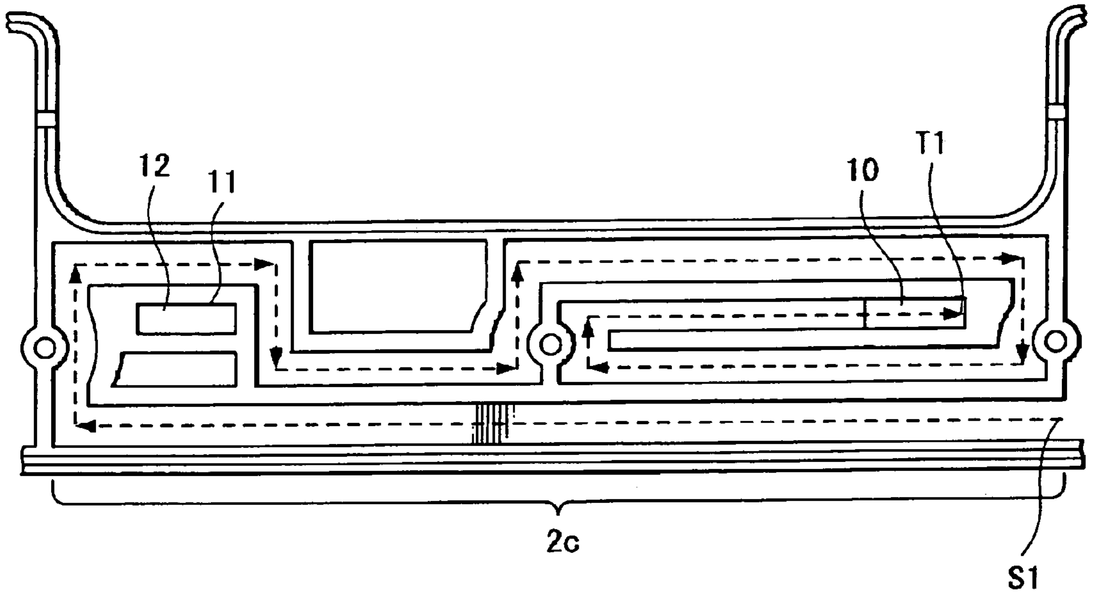
FIG. 7 is a view showing a spiral route in the front surface side box according to FIGS. 1 to 3.

FIG. 7 is a view in which the spiral route in the area 2*c* is shown by arrows of broken lines so as to show the route clearly. The spiral route extends in a direction perpendicular to a thickness direction of the front surface side box 2, with the portion S1 continuous with the area 2*a* serving as the start of the route, and is curved to have the total length longer than the length of the area 2*c* (to extend going back and forth more than once in the area 2*c*). The total length of the route to the end T1 is approximately 439 mm.

As shown in FIG. 7 and FIGS. 2 and 3, the front surface side box 2 has an opening 10 in a position corresponding to the end T1 of the spiral route.

Further, as shown in FIG. 7 and FIG. 1, in the area 2*c*, there is a portion 11 isolated from the spiral route by the wall 9. As shown in FIG. 7 and FIGS. 2 and 3, the front surface side box 2 has an opening 12 also in a position corresponding to the isolated portion 11.

On the other hand, as shown in FIG. 2, in the back surface side box 3, an area 3*c* positioned between the area 3*a* and the area 3*b* is continuous with the area 3*b* at one portion S2 but is separated from the area 3*a* by a wall 13 whose height is the same as the thickness of the back surface side box 3. In the area 3*c*, a spiral route is formed by a wall 14 in the same manner as in the area 2*c* of the front surface side box 2.

Figure 8:
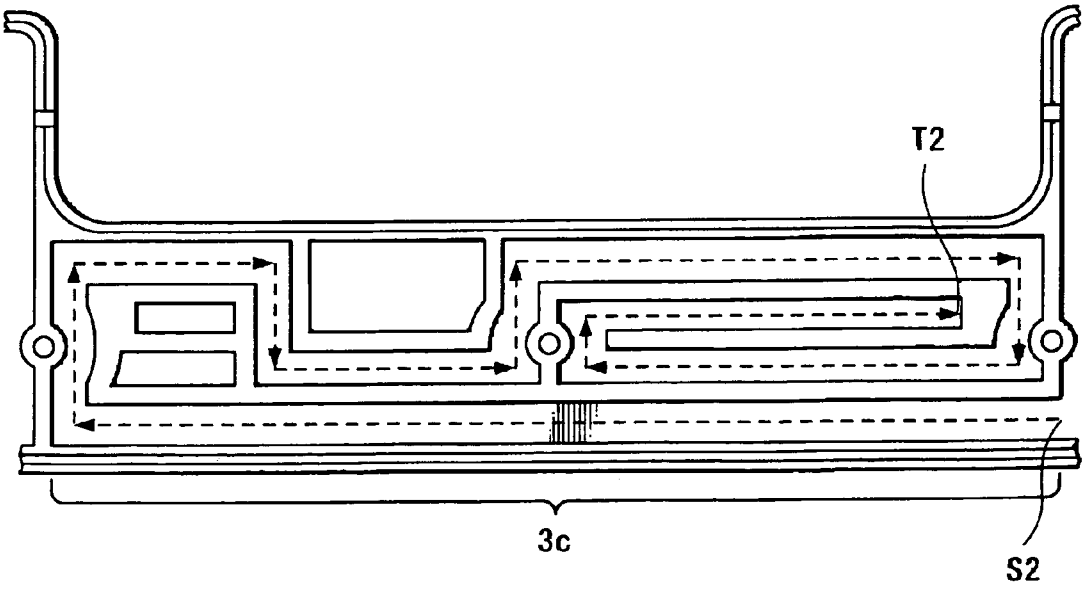
FIG. 8 is a view showing a spiral route in the back surface side box according to FIGS. 1 to 3.

The dimensions of the back surface side box 3 and the dimensions of the area 3*c* are as a whole the same as the dimensions of the front surface side box 2 and the dimensions of the area 2*c* shown in FIG. 6. The width of the spiral route in the area 3*c* and the total length thereof from the start (the portion S2 continuous with the area 3*b*) to the end T2 are also the same as the width and total length of the spiral route in the area 2*c*. FIG. 8 is a view in which the spiral route in the area 3*c* is shown by arrows of broken lines so as to show the route clearly.

As shown in FIGS. 1 and 2, the cushion 4 is shaped like a window frame at the portions corresponding to the areas 2*a* and 3*a* and the areas 2*b* and 3*b*, but is shaped like a sheet at the portion corresponding to the areas 2*c* and 3*c*, and therefore, the cushion 4 also functions as a partition board which separates the area 2*c* and the area 3*c*. In the sheet-like portion of the cushion 4, however, only a hole 15 is provided in a position corresponding to the end T2 of the spiral route in the area 3*c*.

As described earlier, in the area 2*c* of the front surface side box 2, the portion 11 isolated from the spiral route is provided, and the position thereof corresponds to the position of the hole 15 of the cushion 4.

When the front surface side box 2 and the back surface side box 3 are fixed to each other with the cushion 4 positioned in between and the loudspeaker box 1 is completed, the area 2*c* of the front surface side box 2 and the area 3*c* of the back surface side box 3 are separated by the cushion 4, and so the space other than both end portions in the loudspeaker box (space of 131 mm as shown in FIG. 6) is divided into a space on the front surface side and a space on the back surface side.

Then, in the space on the front surface side, a duct having a spiral route as shown by the arrows of broken lines in FIG. 7 is formed with the area 2*c* and cushion 4. The end T1 of the spiral route leads to the opening 10 of the front surface side box 2. Therefore, regarding this duct, the portion S1 continuous with the area 2*a* is an internal opening, and the opening 10 of the front surface side box 2 is an external opening. Then, with the loudspeaker unit 6 being installed in the areas 2*a* and 3*a*, a sound generated from the back surface of the loudspeaker unit 6 is emitted from the opening 10 of the front surface side box 2 to the outside through this duct.

Further, in the space on the back surface side, a duct having a spiral route as shown by the arrows of broken lines in FIG. 8 is formed with the area 3*c* and the cushion 4. The end T2 of the spiral route leads to the opening 12 of the front surface side box 2 via the hole 15 in the cushion 4 and the isolated portion 11 in the area 2*c* of the front surface side box 2. Therefore, regarding this duct, the portion S2 continuous with the area 3*b* is an internal opening, and the opening 12 of the front surface side box 2 is an external opening. Then, with the loudspeaker unit 7 being installed in the areas 2*b* and 3*b*, a sound generated from the back surface of the loudspeaker unit 7 is emitted from the opening 12 of the front surface side box 2 to the outside through this duct.

As described above, in this loudspeaker box 1, one of the two bass reflex ducts of the loudspeaker units 6 and 7 is arranged toward the front of the loudspeaker apparatus and the other arranged toward the rear of the loudspeaker apparatus. Specifically, the two ducts are arranged with a certain distance from each other in an anteroposterior direction (thickness direction) of the loudspeaker apparatus.

Further, each of routes of the two ducts is extended in a direction perpendicular (vertical and lateral directions of the loudspeaker apparatus) to an anteroposterior direction (thickness direction) of the loudspeaker apparatus, and is curved within a plane perpendicular to the anteroposterior direction (within planes in vertical and lateral directions of the loudspeaker apparatus).

Therefore, the routes of the two ducts can be extended in vertical and lateral directions of the loudspeaker apparatus without restricting each other and can be made to go back and forth within planes in the vertical and lateral directions of the loudspeaker apparatus. Accordingly, each of the routes of the two ducts can be made long, though the loudspeaker box 1 is made thin.

Consequently, in the image display apparatus 21 shown in FIG. 4, a bass reflex type loudspeaker apparatus can be installed in a narrow space, and sounds generated from the back surfaces of the loudspeaker units 6 and 7 of this bass reflex type loudspeaker apparatus can be emitted to the outside from the bass reflex ducts whose routes are made long.

Further, regarding the loudspeaker box 1, the space inside the loudspeaker box 1 is divided into a space on the front surface side and a space on the back surface side, using the cushion 4 parallel to an anteroposterior direction of the loudspeaker apparatus as a partition board, and one duct is arranged in each space.

Therefore, the two ducts are arranged with a certain distance from each other in an anteroposterior direction (thickness direction) of the loudspeaker apparatus with a simplified structure and without high cost.

Further, regarding the loudspeaker box 1, the cushion 4 has the hole 15, which connects the space on the front surface side and the space on the back surface side, in a position corresponding to the end T2 of the spiral route of the duct in the space on the back surface side. In the space on the front surface side, the portion 11 connected to the space on the back surface side by means of this hole 15 is isolated from the route of the duct. The front surface side box 2 has the opening 10 (external opening for the duct on the front surface side) in a position corresponding to the position of the end T1 of the spiral route of the duct in the space on the front surface side, and has the opening 12 (external opening for the duct on the back surface side) in a position corresponding to the position of the hole 15.

With the above structure, though the loudspeaker box 1 is made thinner, sounds generated from the back surfaces of the loudspeaker units 6 and 7 can be emitted in the same direction (toward the front of the loudspeaker apparatus) through the two ducts whose routes are elongated.

Next, the measurement results of the frequency characteristic of a bass reflex type loudspeaker apparatus in which the loudspeaker units 6 and 7 are attached to the loudspeaker box 1 are explained as compared with the measurement results of a bass reflex type loudspeaker apparatus in which pipe-shaped ducts are provided.

Figure 9:
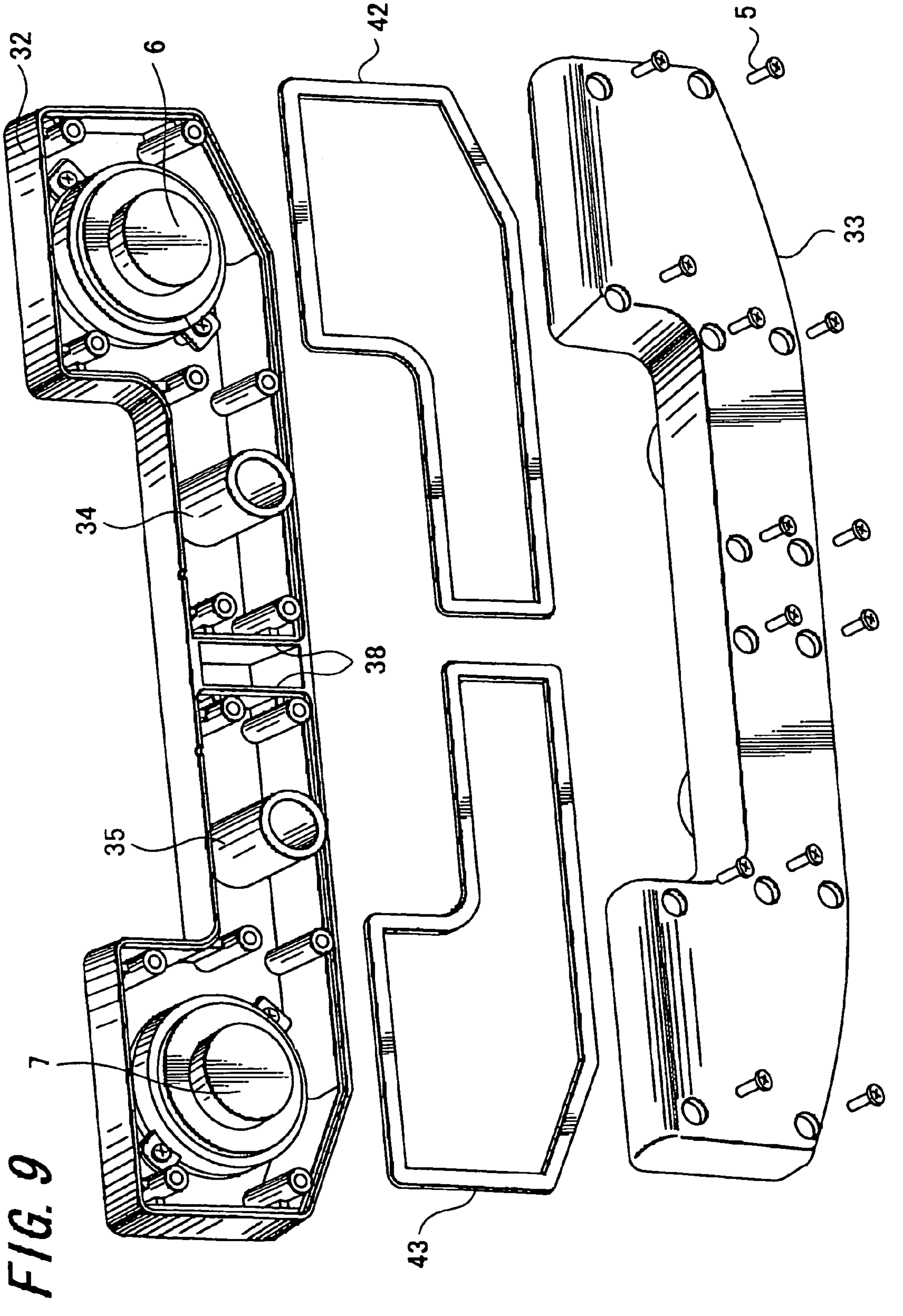
FIG. 9 is a view showing the structure of a loudspeaker box in which pipe-shaped ducts are provided.
Figure 10:
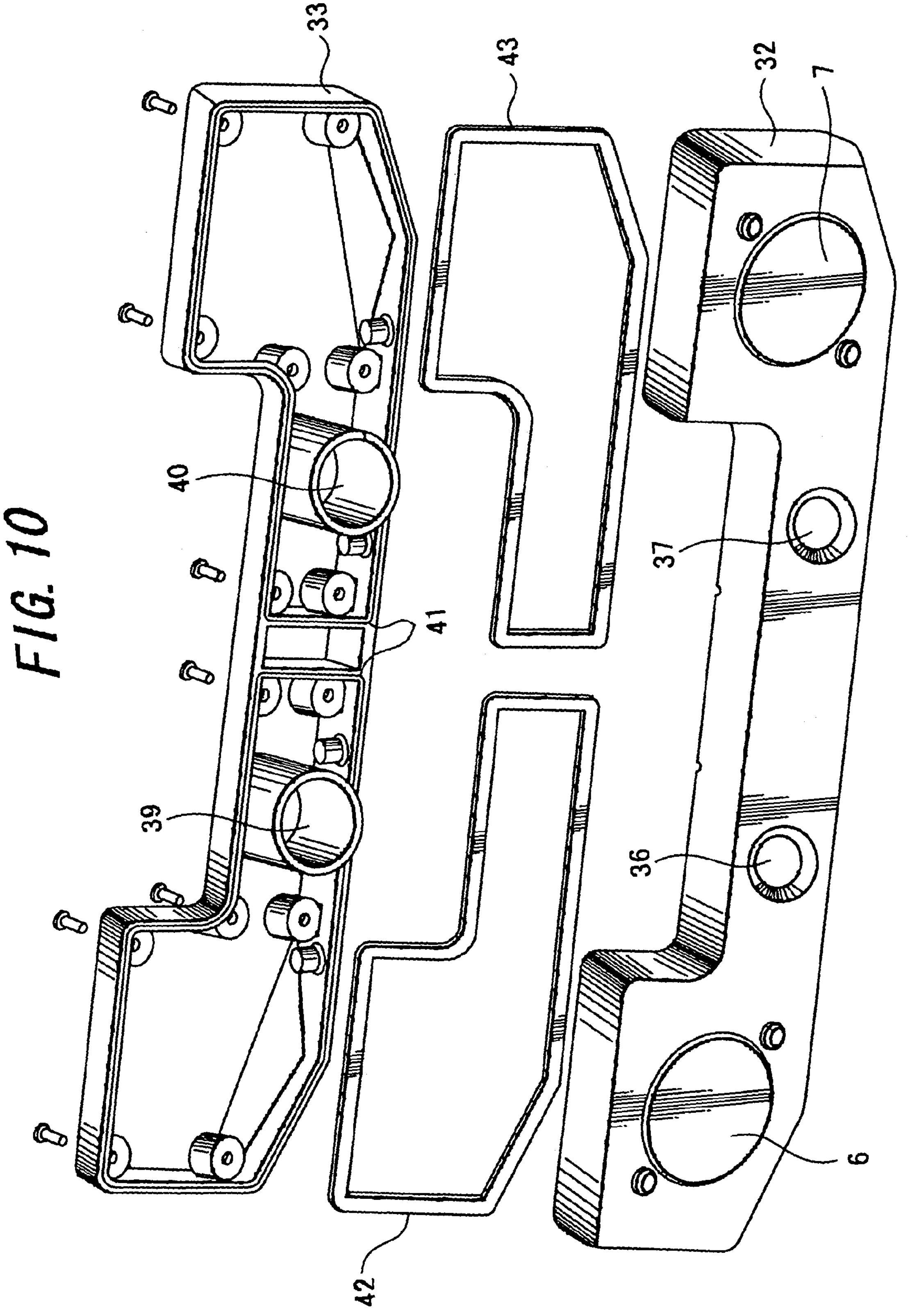
FIG. 10 is a view showing the structure of a loudspeaker box in which pipe-shaped ducts are provided.
Figure 11:
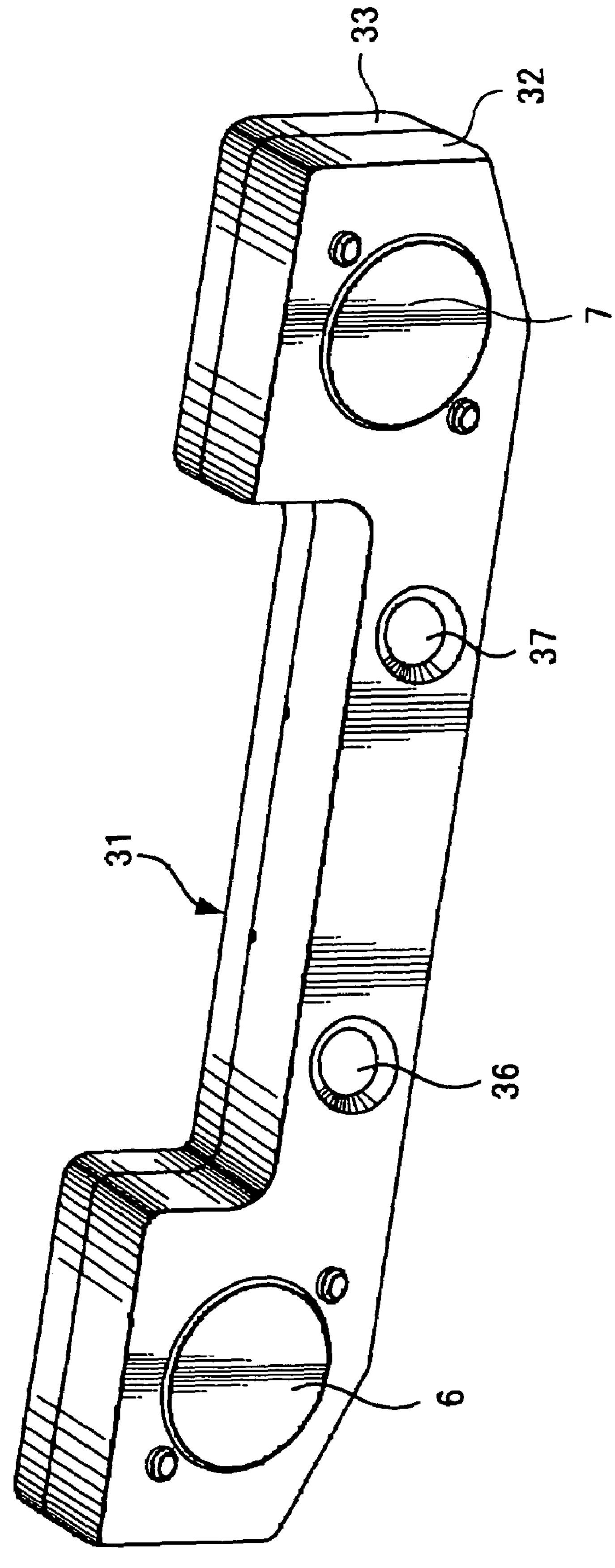
FIG. 11 is a view showing the structure of a loudspeaker box in which pipe-shaped ducts are provided.

First, FIGS. 9 to 11 are views showing the structure of a loudspeaker box in which pipe-shaped ducts are provided to be compared (FIG. 9 is an exploded view seen from the back surface side, FIG. 10 is an exploded view seen from the front surface side, and FIG. 11 is a perspective view seen from the front surface side). A loudspeaker box 31 has the shape and size similar to those of the loudspeaker box 1 as a whole, but is different from the loudspeaker box 1 only with respect to the duct structure. For that reason, only the structure of the duct is to be explained.

As shown in FIG. 9, in a front surface side box 32 of the loudspeaker box 31, a pipe 34 which extends in an anteroposterior direction (thickness direction) of the loudspeaker apparatus is formed in a position toward an area where a loudspeaker unit 6 is installed. Further, in the front surface side box 32, a pipe 35 which similarly extends in a thickness direction is formed in a position toward an area where a loudspeaker unit 7 is installed. The length of these pipes 34 and 35 is larger than the thickness of the front surface side box 32 but is smaller than the thickness of the space inside the loudspeaker box 31. As shown in FIGS. 10 and 11, the front surface side box 32 has external openings 36 and 37 of these pipes 34 and 35.

Further, as shown in FIG. 9, in the front surface side box 32, a wall 38 whose height is the same as the thickness of the front surface side box 32 is formed in a position between the pipes 34 and 35.

On the other hand, as shown in FIG. 10, in a back surface side box 33 of the loudspeaker box 31, a pipe 39 whose internal diameter is larger than the external diameter of the pipe 34 and whose length is smaller than that of the pipe 34 is formed in a position corresponding to the position of the pipe 34 of the front surface side box 32. Further, in the back surface side box 33, a pipe 40 whose internal diameter is larger than the external diameter of the pipe 35 and whose length is smaller than that of the pipe 35 is formed in a position corresponding to the position of the pipe 35 of the front surface side box 32. Further, in the back surface side box 33, a wall 41 whose height is the same as the thickness of the back surface side box 33 is formed in a position corresponding to the position of the wall 38 of the front surface side box 32.

Figure 12:
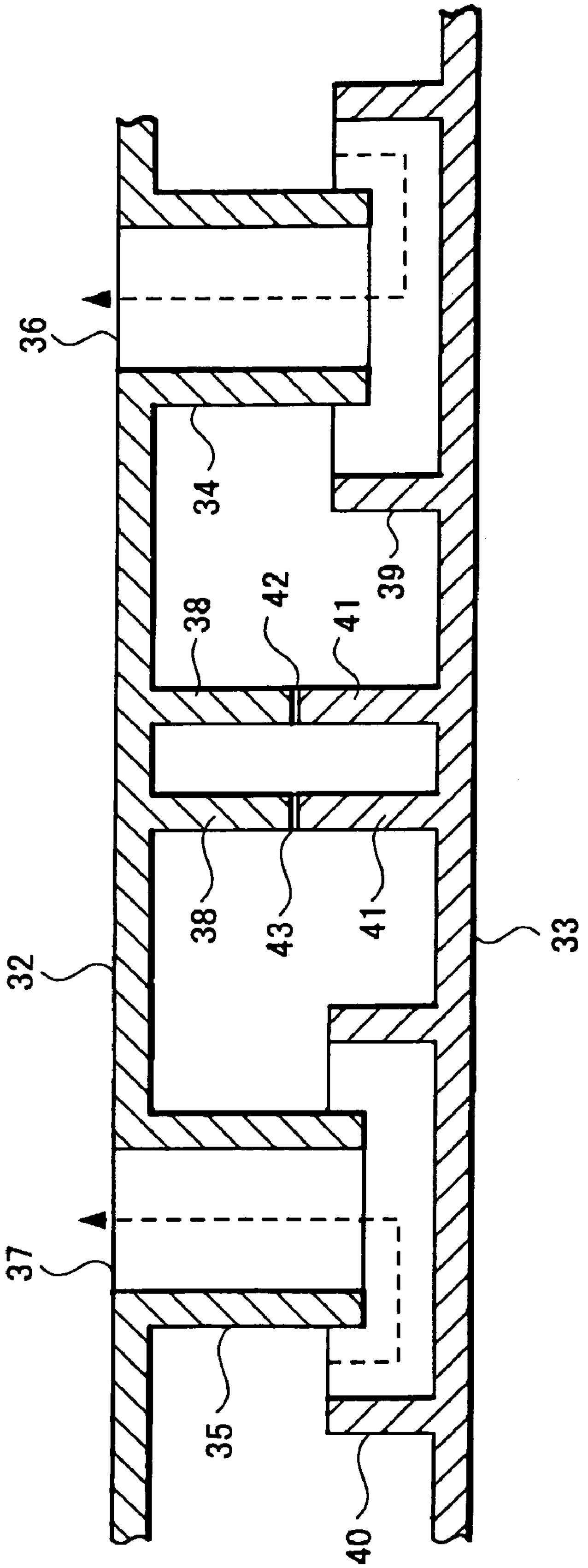
FIG. 12 is a view showing the ducts formed in the loudspeaker box of FIGS. 9 to 11.

When the front surface side box 32 and the back surface side box 33 are fixed to each other with the cushions 42 and 43 in the shape of window frames positioned in between and the loudspeaker box 31 is completed, as shown in FIG. 12, the internal opening of the pipe 34 of the front surface side box 32 is positioned inside the pipe 39 of the back surface side box 33 without touching the pipe 39. In addition, the internal opening of the pipe 35 of the front surface side box 32 is positioned inside the pipe 40 of the back surface side box 33 without touching the pipe 40. Thus, two ducts having such routes as shown by the arrows of broken lines are formed. Each of the routes is approximately 56 mm in total length. In addition, the spaces having these two ducts are separated from each other by the walls 38 and 41.

Therefore, with the loudspeaker units 6 and 7 being installed, sounds generated from the back surfaces of the loudspeaker units 6 and 7 are emitted from the external openings 36 and 37 of the pipes 34 and 35 to the outside through the ducts, respectively.

Figure 13:
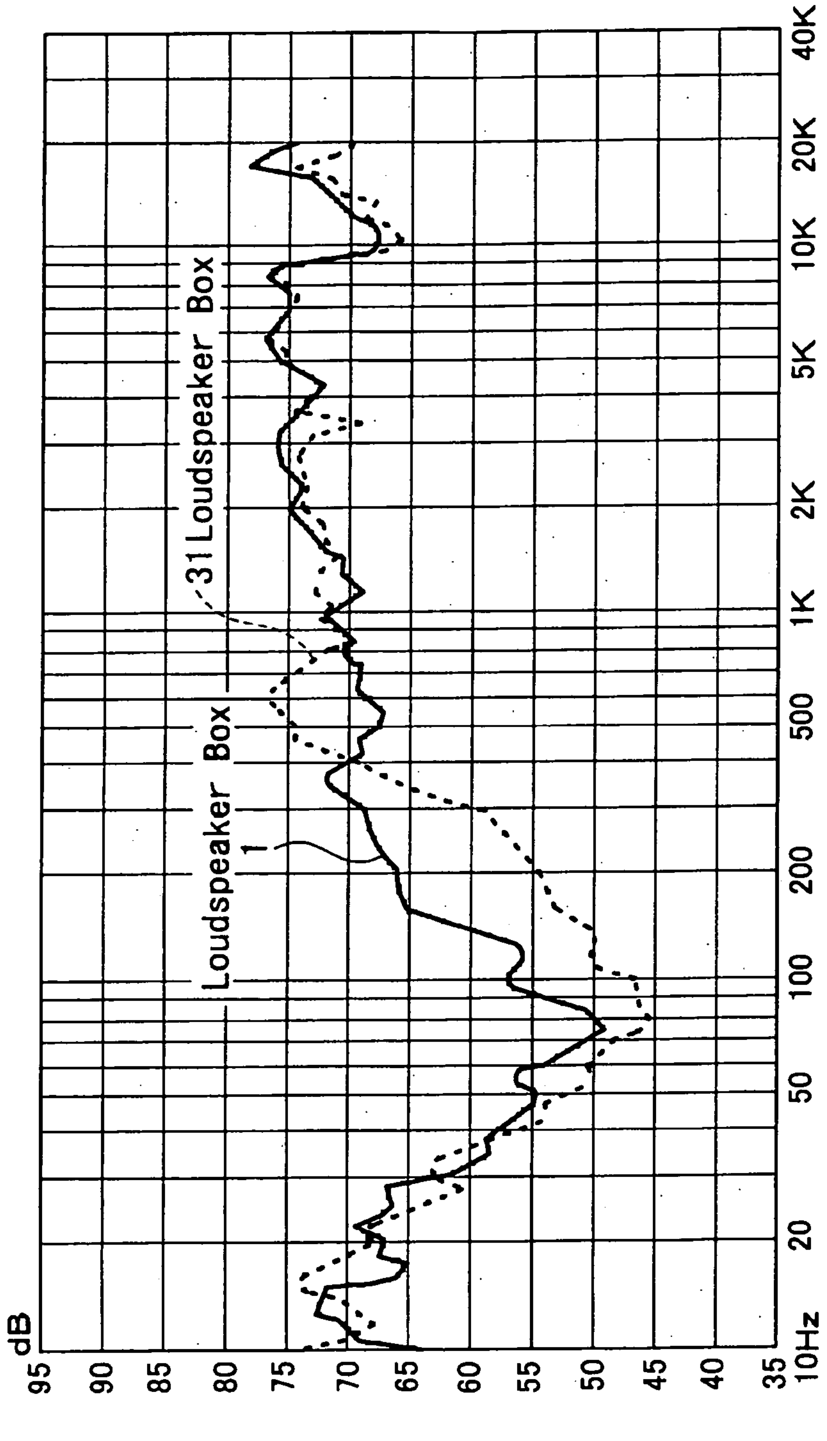

FIG. 13 is a diagram showing the measurement results of the frequency characteristic of a bass reflex type loudspeaker apparatus in which the loudspeaker units 6 and 7 were attached to the loudspeaker box 1 according to an embodiment of the present invention, with the measurement results of the frequency characteristic of a bass reflex type loudspeaker apparatus in which the same loudspeaker units 6 and 7 were attached to the loudspeaker box 31 in FIGS. 9 to 11. In the case of the loudspeaker box 31, the level in a low range of around 200 Hz was low, whereas in the case of the loudspeaker box 1, the level in the low sound range around 200 Hz was greatly improved. In this way, such measurement results were obtained in which the characteristic of a low sound range was greatly improved regarding the loudspeaker box 1 to which the present invention was applied.

It should be noted that although external openings (openings 10 and 12) of two ducts are formed in the front surface side box 2 in the loudspeaker box 1 in the above described example, external openings of two ducts may be formed in the back surface side box 3 as another example.

Figure 14:
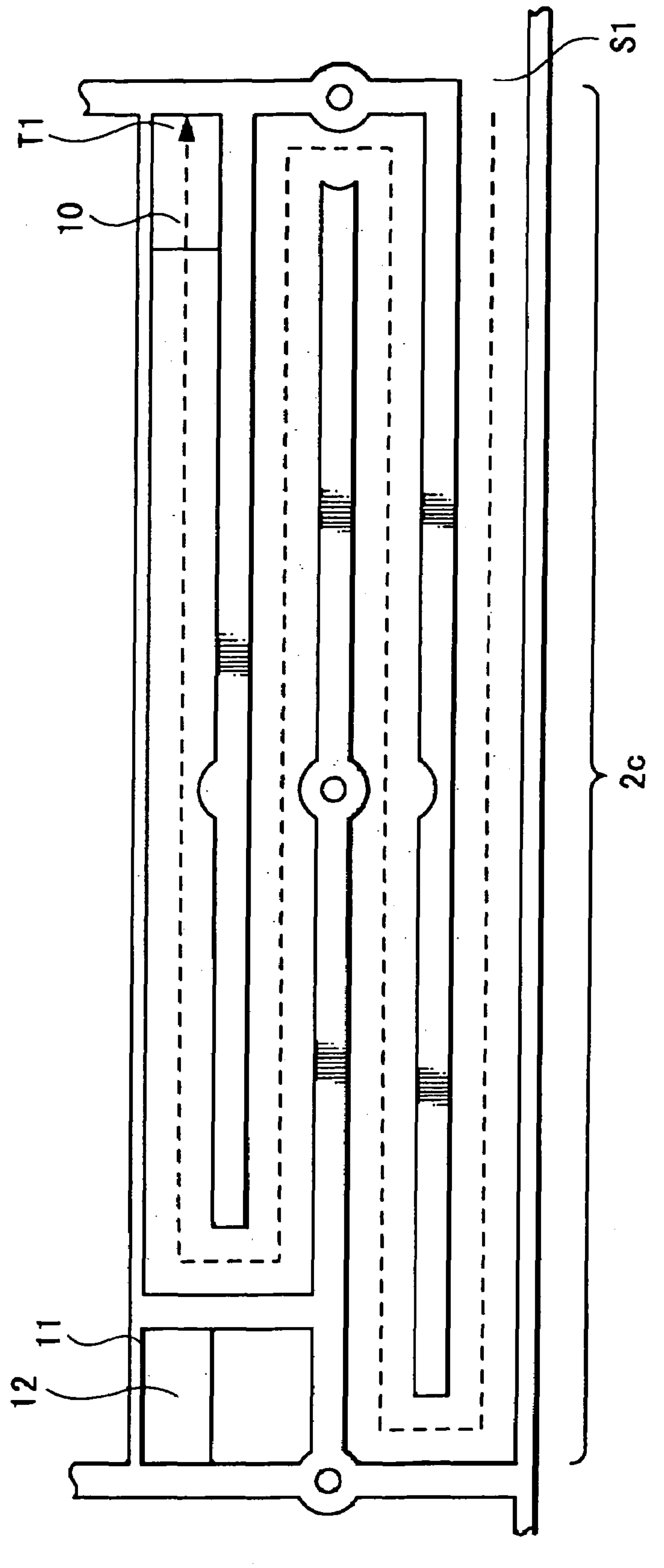
FIG. 14 is a view showing an example in which a duct with an S-shaped route is formed.

Further, although a spiral route is formed in the areas 2*c* and 3*c* in the examples above, a route having other shape than spiral may be formed in the areas 2*c* and 3*c*. FIG. 14 is a view showing an example in which an S-shaped route is formed in the area 2*c*. In FIG. 14, the S-shaped route is shown by an arrow of a broken line so as to show the S-shaped route clearly in a similar manner to FIG. 7. Further, the end T1, the opening 10, the portion 11 and the opening 12, which are shown in FIG. 7, are given the same numerals, and the positions thereof are modified to be shown suitably for the S-shaped route.

Further, in the example above, the cushion 4 is used as a partition board and the space inside the loudspeaker box 1 is divided into a space on the front surface side and a space on the back surface side, and one duct is arranged in each space. However, using other method than the above, two ducts may be arranged with a certain distance from each other in an anteroposterior direction (thickness direction) of the loudspeaker apparatus. As an example thereof, two spirally-curved hollow tubes are arranged with a certain distance from each other in an anteroposterior direction of the loudspeaker apparatus, and each tube is used as a duct.

Further, in the above example, the route of each duct is curved within planes in vertical and lateral directions of the loudspeaker apparatus. However, as another example, the route of each duct may be extended in vertical and lateral directions of the loudspeaker apparatus, but may not be curved within planes in vertical and lateral directions of the loudspeaker apparatus and may be curved in an anteroposterior direction (thickness direction) of the loudspeaker apparatus. With the structure, the routes of ducts can be made long in comparison with those of pipe-shaped ducts in related art, in the case where a loudspeaker box is thinned.

Further, although in the example above the present invention is applied to a loudspeaker box capable of two loudspeaker units being installed, the present invention may also be applied to a loudspeaker box in which only one loudspeaker unit can be installed.

Further, although being applied to a loudspeaker apparatus installed in a direct-view image display apparatus in the example above, the present invention can also be applied to a system stereo, a radio, a cassette recorder, in-car audio equipment, an independent loudspeaker apparatus and the like.

It should be understood by those skilled in the art that various modifications, combinations, sub-combinations and alterations may occur depending on design requirements and other factors insofar as they are within the scope of the appended claims or the equivalents thereof.

What is claimed is:

1. A bass reflex type loudspeaker apparatus, comprising:

a loudspeaker box;

a first loudspeaker unit installed in the loudspeaker box;

a second loudspeaker unit installed in the loudspeaker box;

a first duct configured to emit a sound generated from a back surface of said first loudspeaker unit to an outside of the loudspeaker apparatus;

a second duct configured to emit a sound generated from a back surface of said second loudspeaker unit to the outside of the loudspeaker apparatus, and the second duct wraps around an opening through which the sound in the first duct is emitted to the outside of the loudspeaker apparatus; and a partition board configured to separate the first duct from the second duct, wherein a route of said first duct is extended in a direction perpendicular to an anteroposterior direction of the loudspeaker apparatus and is curved, and the first duct passes through an opening in the partition board.

2. A bass reflex type loudspeaker apparatus according to claim 1, wherein the route of said first duct is curved within a plane perpendicular to said anteroposterior direction.

3. A bass reflex type loudspeaker apparatus according to claim 2, wherein the route of said first duct is curved to be spiral-shaped within a plane perpendicular to said anteroposterior direction.

4. A bass reflex type loudspeaker apparatus according to claim 2, wherein the route of said first duct is curved to be S-shaped within a plane perpendicular to said anteroposterior direction.

5. A bass reflex type loudspeaker apparatus, comprising:

a loudspeaker box;

a first loudspeaker unit installed in the loudspeaker box;

a second loudspeaker unit installed in the loudspeaker box; and a first duct connected to the first loudspeaker unit and configured to emit sounds generated from a back surface of the first loudspeaker unit to an outside of the loudspeaker apparatus;

a second duct connected to the second loudspeaker unit and configured to emit sounds generated from a back surface of said second loudspeaker unit to the outside of the loudspeaker apparatus; and a partition board configured to separate the first duct from the second duct, wherein one of said first and second ducts is arranged toward a front of the loudspeaker apparatus and the other is arranged toward a rear of the loudspeaker apparatus, each of routes of said first and second ducts is extended in a direction perpendicular to an anteroposterior direction of the loudspeaker apparatus and is curved within a plane perpendicular to said anteroposterior direction, and the second duct passes through a hole in the partition board.

6. A bass reflex type loudspeaker apparatus according to claim 5, wherein space inside said loudspeaker box is divided into a first space and a second space by the partition board parallel to said anteroposterior direction, and said first duct is arranged in said first space and said second duct is arranged in said second space.

7. A bass reflex type loudspeaker apparatus according to claim 6, wherein the hole of said partition board connects said first and second spaces in a position corresponding to an end of the route of said second duct, a portion in said first space connected to said second space by means of said hole is isolated from the route of said first duct, and on the side of said first space, said loudspeaker box has a first opening for said first duct in a position corresponding to the position of an end of the route of said first duct and a second opening for said second duct in a position corresponding to the position of said hole of said partition board.

8. A loudspeaker box for a bass reflex type loudspeaker apparatus, comprising:

a first area configured to receive a first loudspeaker unit;

a second area configured to receive a second loudspeaker unit;

a first duct configured to emit a sound generated from a back surface of said first loudspeaker unit to an outside of the loudspeaker apparatus;

a second duct configured to emit a sound generated from a back surface of said second loudspeaker unit to the outside of the loudspeaker apparatus, and the second duct wraps around an opening through which the sound in the first duct is configured to be emitted to the outside of the loudspeaker apparatus; and a partition board configured to separate the first duct from the second duct, wherein a route of said first duct is extended in a direction perpendicular to an anteroposterior direction of the loudspeaker apparatus and is curved, and the first duct passes through an opening in the partition board.

9. A loudspeaker box according to claim 8, wherein the route of said first duct is curved within a plane perpendicular to said anteroposterior direction.

10. A loudspeaker box according to claim 9, wherein the route of said first duct is curved to be spiral-shaped within a plane perpendicular to said anteroposterior direction.

11. A loudspeaker box according to claim 9, wherein the route of said first duct is curved to be S-shaped within a plane perpendicular to said anteroposterior direction.

12. A loudspeaker box for a bass reflex type loudspeaker apparatus, comprising:

a first area configured to receive a first loudspeaker unit;

a second area configured to receive a second loudspeaker unit; and a first duct connected to the first loudspeaker unit and configured to emit sounds generated from a back surface of the first loudspeaker unit to an outside of the loudspeaker box;

a second duct connected to the second loudspeaker unit and configured to emit sounds generated from a back surface of the second loudspeaker unit to the outside of the loudspeaker box; and a partition board configured to separate the first duct from the second duct, wherein one of said first and second ducts is arranged toward a front of the loudspeaker box and the other is arranged toward a rear of the loudspeaker box, each of routes of said first and second ducts is extended in a direction perpendicular to an anteroposterior direction of the loudspeaker box and is curved within a plane perpendicular to said anteroposterior direction, and the second duct passes through a hole in the partition board.

13. A loudspeaker box according to claim 12, wherein space inside said loudspeaker box is divided into a first space and a second space by the partition board parallel to said anteroposterior direction, and said first duct is arranged in said first space and said second duct is arranged in said second space.

14. A loudspeaker box according to claim 13, wherein the hole of said partition board connects said first and second spaces in a position corresponding to an end of the route of said second duct, a portion in said first space connected to said second space by means of said hole is isolated from the route of said first duct, and on the side of said first space, said loudspeaker box has a first opening for said first duct in a position corresponding to the position of an end of the route of said first duct and a second opening for said second duct in a position corresponding to the position of said hole of said partition board.

15. An image display apparatus, comprising:

a display unit configured to display an image; and a bass reflex type loudspeaker apparatus that includes a first duct provided in a loudspeaker box and configured to emit a sound generated from a back surface of a first loudspeaker unit to an outside of the loudspeaker box, a route of which is extended in a direction perpendicular to an anteroposterior direction of the loudspeaker apparatus, is curved, and passes through an opening in a partition board configured to separate the first duct from a second duct, and the second duct is configured to emit a sound generated from a back surface of a second loudspeaker unit to the outside of the loudspeaker box, and the second duct wraps around an opening through which the sound in the first duct is emitted to the outside of the loudspeaker box.

16. An image display apparatus, comprising:

a display unit to display an image; and a bass reflex type loudspeaker apparatus that includes a first duct and a second duct provided in a loudspeaker box and configured to emit sounds generated from back surfaces of a first loudspeaker unit and a second loudspeaker unit to an outside of the image display apparatus, one of which is arranged toward a front of the loudspeaker apparatus and the other of which is arranged toward a rear of the loudspeaker apparatus, wherein each of routes of said first and second ducts is extended in a direction perpendicular to an anteroposterior direction of the loudspeaker apparatus and is curved within a plane perpendicular to said anteroposterior direction, and the second duct passes through an opening in a partition board configured to separate the second duct from the first duct.

* * * * *